(12) United States Patent
Fan

(10) Patent No.: US 12,112,901 B2
(45) Date of Patent: Oct. 8, 2024

(54) ELECTRONIC DEVICE

(71) Applicant: GUANGDONG OPPO MOBILE TELECOMMUNICATIONS CORP., LTD., Guangdong (CN)

(72) Inventor: Wei Fan, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 87 days.

(21) Appl. No.: 17/938,036

(22) Filed: Oct. 4, 2022

(65) Prior Publication Data

US 2023/0028551 A1 Jan. 26, 2023

Related U.S. Application Data

(63) Continuation of application No. PCT/CN2021/082433, filed on Mar. 23, 2021.

(30) Foreign Application Priority Data

May 7, 2020 (CN) .......................... 202020737960.7

(51) Int. Cl.
*H01H 13/14* (2006.01)
*H05K 5/02* (2006.01)

(52) U.S. Cl.
CPC ........... *H01H 13/14* (2013.01); *H05K 5/0217* (2013.01)

(58) Field of Classification Search
CPC .......... H05K 5/00; H05K 5/02; H05K 5/0217; H01H 13/00; H01H 13/10; H01H 13/14; H01H 3/12; H01H 9/02; H01H 9/0214; H01H 9/0242; H01H 9/04; H01H 9/20; H01H 13/50; H01H 2013/00; H01H 2013/04; H01H 2013/50; H01H 2013/52; H01H 2221/00; H01H 2223/034; H01H 2300/016
See application file for complete search history.

(56) References Cited

U.S. PATENT DOCUMENTS 4,149,662 A * 4/1979 Ramaciere ............... A44C 5/14
224/164

FOREIGN PATENT DOCUMENTS

| CN | 101335142 | 12/2008 |
|---|---|---|
| CN | 105957758 | 9/2016 |

(Continued)

OTHER PUBLICATIONS

EPO, Extended European Search Report for EP Application No. 21799828.5, Aug. 14, 2023.

(Continued)

*Primary Examiner* — Anthony R Jimenez
(74) *Attorney, Agent, or Firm* — Hodgson Russ LLP

(57) ABSTRACT

An electronic device includes a frame, a stop pin, and a button. The frame defines a button hole and a pin hole in communication with the button hole. An inner side wall of the button hole is provided with a stop protrusion at a position away from the pin hole. The stop pin is inserted into the pin hole and partially received in the button hole. The button is provided with a first hook and a second hook away from the first hook. The first hook hooks the stop protrusion. The second hook hooks part of the stop pin in the button hole. The button can be pressed to slide a preset distance under a limit of the stop pin and the stop protrusion.

20 Claims, 10 Drawing Sheets

(56) References Cited

FOREIGN PATENT DOCUMENTS

| | | |
|---|---|---|
| CN | 205845781 | 12/2016 |
| CN | 107659700 | 2/2018 |
| CN | 106304732 | 3/2019 |
| CN | 208656877 | 3/2019 |
| CN | 110138949 | 8/2019 |
| CN | 209388922 | 9/2019 |
| CN | 110764626 | 2/2020 |
| CN | 210136394 | 3/2020 |
| CN | 111048343 | 4/2020 |
| EP | 4020513 | 6/2022 |
| TW | 201933397 | 8/2019 |
| WO | 2016039787 | 3/2016 |

OTHER PUBLICATIONS

WIPO, International Search Report and Written Opinion for International Application No. PCT/CN2021/082433, Jun. 3, 2021.

\* cited by examiner

ELECTRONIC DEVICE

CROSS-REFERENCE TO RELATED APPLICATIONS

This application is a continuation of International Application No. PCT/CN2021/082433, filed Mar. 23, 2021, which claims priority to Chinese Patent Application No. 202020737960.7, filed May 7, 2020, the entire disclosures of which are incorporated herein by reference.

TECHNICAL FIELD

The disclosure relates to the field of communication devices, and particularly to an electronic device.

BACKGROUND

Generally, electronic devices are provided with buttons, such that the electronic devices can be controlled through the buttons. Currently, the button is usually provided with a snap ring at one end of a button post, the snap ring abuts against a limit structure, and the limit structure is used to limit the snap ring, so as to prevent the button from being detached from a frame of the electronic device and prevent the button from being damaged. Due to a limited installation space at the end of the button post, the structural performance of the snap ring and the end of the button post is lowered, and there are difficulties in assembly.

SUMMARY

An electronic device is provided in implementation of the disclosure. The electronic device includes a frame, a stop pin, and a button. The frame defines a button hole and a pin hole in communication with the button hole. An inner side wall of the button hole is provided with a stop protrusion at a position away from the pin hole. The stop pin is inserted into the pin hole and partially received in the button hole. The button is provided with a first hook and a second hook away from the first hook. The first hook is used for engaging with the stop protrusion and the second hook is used for engaging with the stop pin to cooperatively limit the button. In an example, the first hook is used for hooking the stop protrusion and the second hook is used for hooking the stop pin to cooperatively limit the button.

BRIEF DESCRIPTION OF THE DRAWINGS

To describe the technical solutions in the implementations of the disclosure more clearly, the following briefly introduces the accompanying drawings required for describing the implementations. Apparently, the accompanying drawings in the following description illustrate some implementations of the disclosure. Those of ordinary skill in the art may also obtain other drawings based on these accompanying drawings without creative efforts.

DETAILED DESCRIPTION OF ILLUSTRATED IMPLEMENTATIONS

Technical solutions in implementations of the disclosure will be described clearly and completely hereinafter with reference to the accompanying drawings in the implementations of the disclosure.

Figure 1:
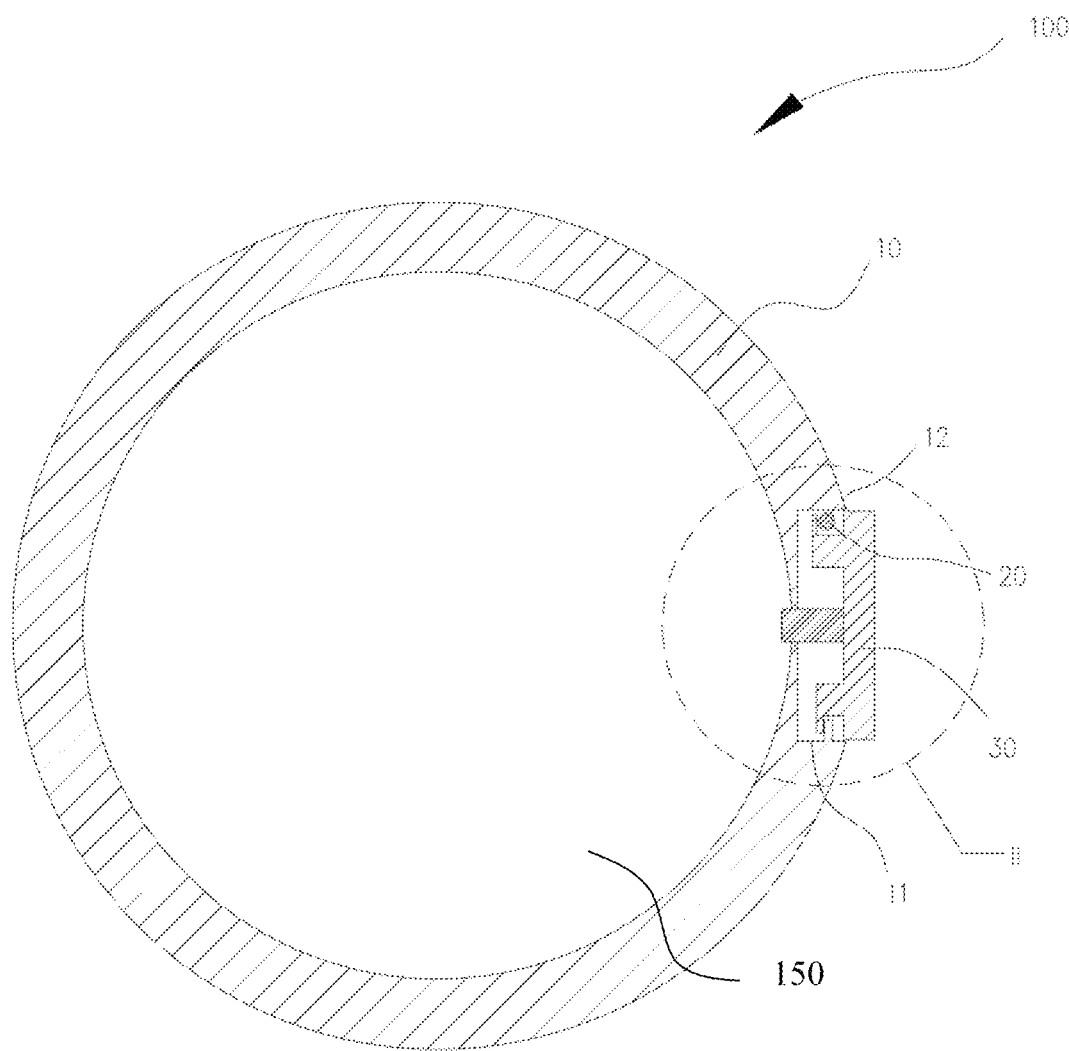
FIG. 1 is a schematic cross-sectional view of an electronic device provided in implementations of the disclosure.
Figure 2:
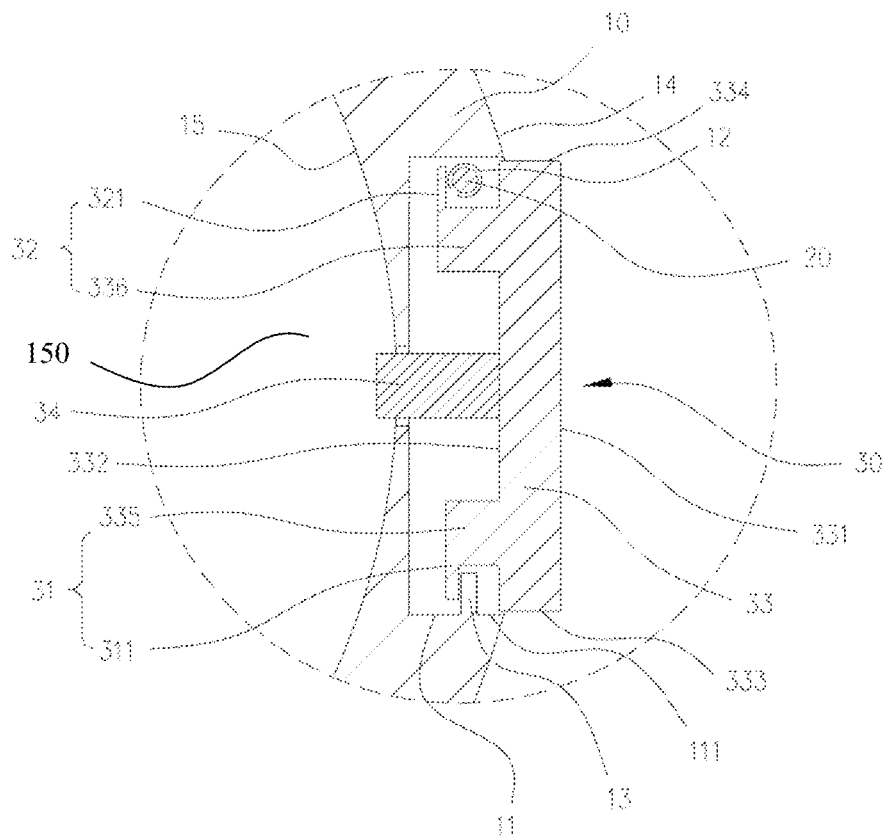
FIG. 2 is an enlarged schematic view of the electronic device at circle II in FIG. 1.
Figure 3:
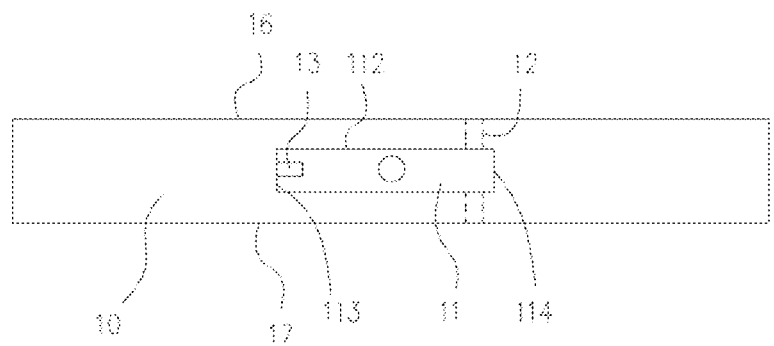
FIG. 3 is a side view of a frame of an electronic device provided in implementations of the disclosure.

Referring to FIGS. 1 to 3, an electronic device 100 is provided. The electronic device 100 includes a frame 10, a stop pin 20, and a button 30. The frame 10 defines a button hole 11 and a pin hole 12 in communication with the button hole 11. An inner side wall of the button hole 11 is provided with a stop protrusion 13 at a position away from the pin hole 12. The stop pin 20 is inserted into the pin hole 12 and partially received in the button hole 11. The button 30 is provided with a first hook 31 and a second hook 32 away from the first hook 31. The first hook 31 is used for engaging with the stop protrusion 13 and the second hook 32 is used for engaging with the stop pin 20 to cooperatively limit the button 30. The first hook 31 is used for hooking the stop protrusion 13 and the second hook 32 is used for hooking part of the stop pin 20 in the button hole 11, to cooperatively limit the button 30.

It can be understood that the electronic device 100 may be a terminal device such as a mobile phone, a tablet computer, a notebook computer, etc., and may also be a smart wearable device such as a smart watch, a smart earphone, smart glasses, etc. When the button 30 is pressed, the button 30 can slide toward an inside of the frame 10, so that the button 30 triggers a signal trigger 60 inside the frame 10. When the button 30 is released, the first hook 31 hooks the stop protrusion 13 and the second hook 32 hooks the stop pin 20 to prevent the button 30 from being detached from the frame 10 and prevent the button 30 from being damaged.

The frame 10 defines the button hole 11 and the pin hole 12 in communication with the button hole 11, the inner side wall of the button hole 11 is provided with the stop protrusion 13 at a position away from the pin hole 12, the stop pin 20 is inserted into the pin hole 12 and partially received in the button hole 11, the first hook 31 of the button 30 hooks the stop protrusion 13, and the second hook 32 of the button 30 hooks the stop pin 20, and thus it can be ensured that the button 30 cannot be detached from the frame 10 to provide the button 30 with a safety limit, it is easy to assemble the button 30 and the frame 10, and a structural stability is high.

In this implementation, the frame 10, serving as a framework of the electronic device 100, can carry various components of the electronic device 100, such that the electronic device 100 is stable in the overall structure. With the aid of rigid stresses of the frame 10, the electronic device 100 has a protective performance such as safety, drop resistance, shatter resistance, and crack resistance. The frame 10 can be closely fit with exterior structures of the electronic device 100 to achieve dustproof, waterproof, fireproof, and other protective performance.

In an implementation, the frame 10 has an outer side surface 14 and an inner side surface 15 opposite to the outer side surface 14. In an example, the outer side surface 14 of the frame 10 is at an outside of the frame 10, and the inner side surface 15 of the frame 10 is at an inside of the frame 10. The inner side surface 15 may be composed of flat surfaces and non-flat surfaces. That is, the inner side surface 15 of the frame 10 may have multiple recessions and multiple protrusions in such a way that the inner side surface 15 of the frame 10 can match various components. The inner side surface 15 is an interface of the frame 10 that can substantially enclose to define an inner space. The outer side surface 14 may be composed of flat surfaces and non-flat surfaces. That is, the outer side surface 14 may also have multiple recessions and multiple protrusions. The outer side surface 14 substantially forms the appearance surface of the frame 10. The inner side surface 15 encloses to form an accommodating space 150. The accommodating space 150 is used for accommodating various functional components such as a mainboard, a signal trigger, a camera, a sensor, a memory, an antenna, and the like.

The frame 10 further has a first end surface 16 and a second end surface 17 opposite to the first end surface 16. The inner side surface 15 and the outer side surface 14 are in connection with the first end surface 16 and the second end surface 17. In an example, the first end surface 16 and the second end surface 17 are disposed between the outer side surface 14 and the inner side surface 15. The button hole 11 extends from the outer side surface toward the inside of the frame 10 and is located between the first end surface 16 and the second end surface 17, and the pin hole 12 extends from the first end surface 16 or the second end surface 17 to the inner side wall of the button hole 11. The first end surface 16 can match front structural members of the electronic device 100. The second end surface 17 can match rear structural members of the electronic device 100. The front structural members refer to structural members facing a user of the electronic device 100 when the electronic device 100 is in use. The rear structural members refer to structural members facing away from the user of the electronic device 100 when the electronic device 100 is in use. For example, the front structural members include a display screen, and the rear structural members include a rear cover. The first end surface 16 and the second end surface 17 may both be composed of flat surfaces and non-flat surfaces. That is, the first end surface 16 and the second end surface 17 may both have multiple recessions and protrusions.

In this implementation, the button hole 11 extends from the outer side surface 14 toward the inner side surface 15. The button hole 11 has a button opening 111 defined on the outer side surface 14. The button 30 is inserted into the button hole 11 from the button opening 111. The button hole 11 further has an inner circumferential wall extending from the button opening 111 toward the inner side surface 15. The inner circumferential wall is in clearance fit with an outer circumferential wall of the button 30. The inner circumferential wall can also provide slidable guide to the button 30, so as to prevent the button 30 from being lifted up. The pin hole 12 penetrates the inner circumferential wall. The stop pin 20 extends into the button hole 11 through an opening of the pin hole 12 that penetrates the inner circumferential wall.

Optionally, the button hole 11 is a rectangular hole. The inner circumferential wall has two long inner side surfaces 112 substantially parallel to the first end surface 16 or the second end surface 17, a first short inner side surface 113, and a second short inner side surface 114 opposite to the first short inner side surface 113. The first short inner side surface 113 and the second short inner side surface 114 are connected with the two long inner side surfaces 112. The stop protrusion 13 extends from the first short inner side surface 113. The pin hole 12 penetrates the long inner side surfaces 112 and is adjacent to the second short inner side surface 114. Part of the stop pin 20 extending into the button hole 11 is adjacent to the second short inner side surface 114. The stop pin 20 can penetrate the long inner side surface 112.

Optionally, the button hole 11 is square. The button hole 11 has two inner side walls opposite to one another. The stop protrusion 13 is disposed on one of the two inner side walls. The stop pin 20 is adjacent to the other of the two inner side walls opposite to the stop protrusion 13.

Optionally, the button hole 11 is circular. The stop protrusion 13 and the stop pin 20 are approximately symmetrically arranged about the central axis of the button hole 11.

Optionally, the frame 10 is circular. The button 30 is disposed on a circumferential side of the frame 10. Alternatively, the frame 10 defines multiple button holes 11 in a circumferential direction, and the electronic device 100 may also include multiple buttons 30 mounted in the button holes 11 respectively.

During installation of the button 30, the first hook 31 of the button 30 first hooks the stop protrusion 13, the second hook 32 is then inserted into the button hole 11, and the second hook 32 is caused to be at a side of the pin hole 12 away from the button opening 111, and finally the stop pin 20 is inserted into the pin hole 12, so that the second hook 32 can hook the stop pin 20.

Further, the button 30 is provided with a button cap 33 and a button post 34 connected with the button cap 33. The button cap 33 matches the button hole 11. The first hook 31 and the second hook 32 are respectively disposed at both ends of the button cap 33 in a length direction of the button cap. The button post 34 is connected with the button cap 33 and located between the first hook 31 and the second hook 32. The button post 34 is connected with the button cap 33 at an inner side of the button cap 33 close to the frame 10.

Specifically, an outer circumferential wall of the button cap 33 is in clearance fit with the inner circumferential wall of the button hole 11. The button cap 33 has an outer end surface 331, an inner end surface 332 opposite to the outer end surface 331, and an outer circumferential surface connected between the outer end surface 331 and the inner end surface 332. The outer circumferential surface has a first short outer side surface 333, a second short outer side surface 334 opposite to the first short outer side surface 333, and two long outer side surfaces connected between the first short outer side surface 333 and the second short outer side surface 334. The first short outer side surface 333 matches the first short inner side surface 113 and the second short outer side surface 334 matches the second short inner side surface 114. The two long outer side surfaces match the long inner side surfaces 112. The inner end surface 332 is inside the button hole 11 and away from the button opening 111. The first hook 31 and the second hook 32 extend from the inner end surface 332. The first hook 31 is close to the first short outer side surface 333 and the second hook 32 is close to the second short outer side surface 334.

Figure 4:
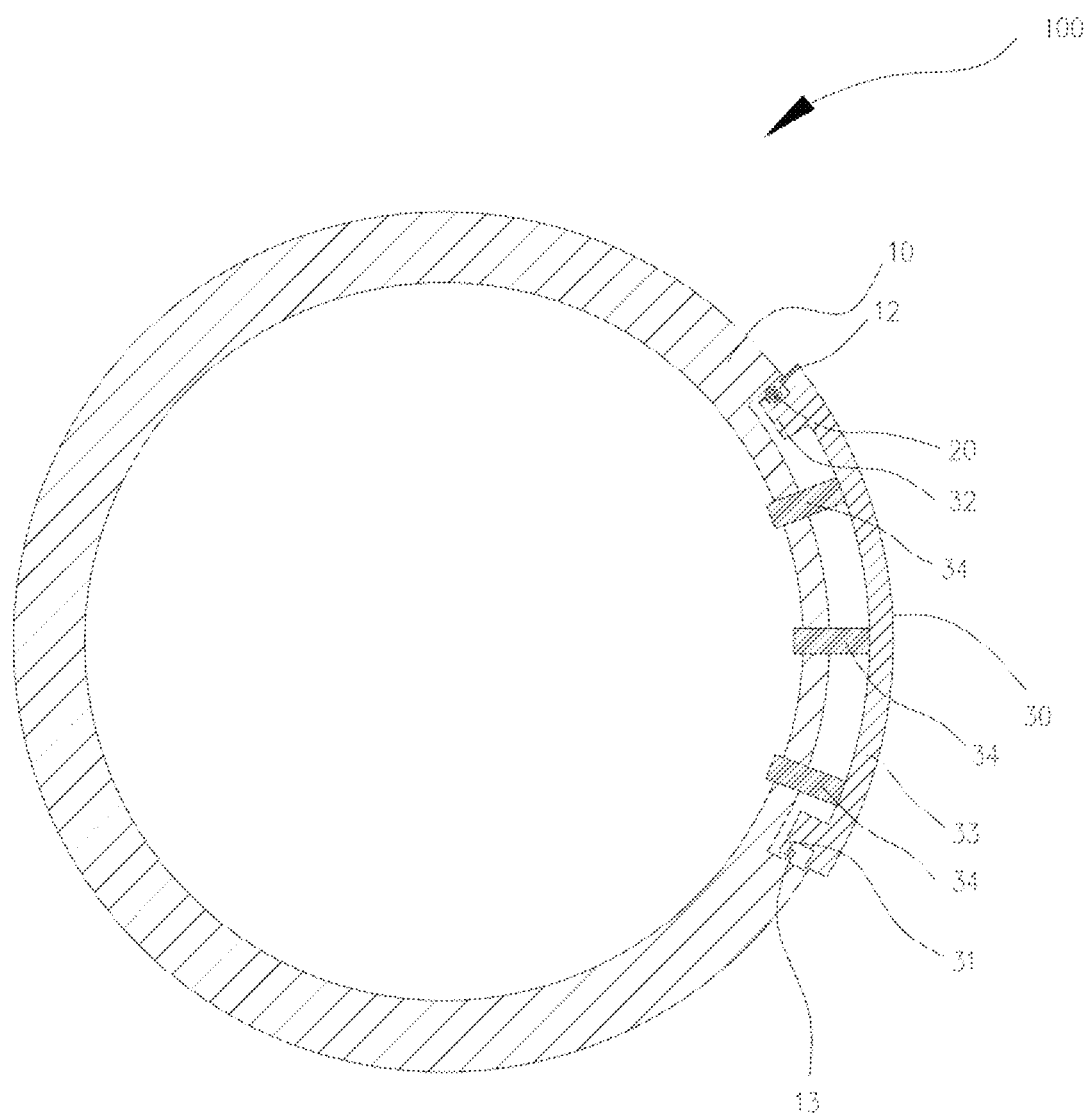
FIG. 4 is another schematic view of an optional electronic device provided in implementations of the disclosure.

Optionally, as illustrated in FIG. 4, the frame 10 is arc-shaped. The button cap 33 is an arc-shaped curved plate. The button cap 33 matches the frame 10 in shape, so that the button cap 33 can have an increased length, and the button cap 33 can be connected with the button posts 34 at multiple positions. As such, various parts of the button cap 33 can be pressed, and various manipulations can be realized through multiple button posts 34.

The button post 34 has a length direction which is substantially perpendicular to the inner side surface 15 and the outer side surface 14 of the frame 10, such that it is convenient for the button post 34 to receive a pressing force applied by the button cap 33 to slide in a direction perpendicular to the inner side surface 15 and the outer side surface 14 of the frame 10, and it can make a sliding force of the button post 34 focus on the signal trigger 60 inside the frame 10. The button post 34 is connected to the inner end surface 332 and is located between the first hook 31 and the second hook 32. The first hook 31 and the second hook 32 exert a balanced limiting force on the button cap 33 to prevent the button cap 33 from being lifted up.

Optionally, when the button 30 is not pressed, a surface of the button cap 33 away from the button post 34 may protrude relative to the outer side surface 14, such that the button cap 33 is easily to be perceived when the user touches an outer side of the frame 10, and it is convenient for the user to press the button cap 33.

Optionally, when the button 30 is not pressed, the surface of the button cap 33 away from the button post 34 may be substantially flush with the outer side surface 14 to improve flatness of outer structures of the frame 10.

Optionally, when the button 30 is not pressed, the surface of the button cap 33 away from the button post 34 can be recessed relative to the outer side surface 14 to prevent the button 30 from being impacted when the electronic device 100 is dropped, so as to prevent the button 30 from being damaged.

Optionally, when the button 30 is not pressed, an end surface of the button post 34 away from the button cap 33 may protrude relative to the inner side surface 15, which facilitates an abutment (or, contact) between the button post 34 and the signal trigger 60.

Optionally, when the button 30 is not pressed, the end surface of the button post 34 away from the button cap 33 may be flush with the inner side surface 15 to ensure the flatness of the interior structure of the frame 10 and improve the utilization rate of the accommodating space 150.

Optionally, when the button 30 is not pressed, the end surface of the button post 34 away from the button cap 33 may be recessed relative to the inner side surface 15. By receiving the pressing force applied by the button cap 33, one end of the button post 34 protrudes relative to the inner side surface 15 to abut against the signal trigger 60. In an implementation, by receiving the pressing force applied by the button cap 33, one end of the button post 34 protrudes relative to the inner side surface 15 to be in contact with the signal trigger 60, so that the signal trigger 60 can be triggered to send signals.

In another implementation, the button cap 33 can also be in a disc shape, and the button hole 11 is circular. The button cap 33 is provided with multiple first hooks 31 and multiple second hooks 32, and each of the multiple first hooks 31 and each of the multiple second hooks 32 is symmetrically arranged around the geometric center of the button cap 33. The geometric center axis of the button cap 33 is aligned with the geometric center axis of the button post 34. There are multiple stop protrusions 13 disposed on the inner side wall of the button hole 11, and multiple stop pins 20 penetrating through an inner wall of the button hole 11. The button cap 33 can also be a triangular, polygonal, or other arbitrary shape plate.

Further, the first hook 31 has a first boss 335 extending from the inner side of the button cap 33 and a first transverse arm 311 extending from one end of the first boss 335. The second hook 32 has a second boss 336 extending from the button cap 33 and a second transverse arm 321 extending from one end of the second boss 336. The stop protrusion 13 is movable between the first transverse arm 311 and the button cap 33. The stop pin 20 is movable between the second transverse arm 321 and the button cap 33. In an example, the stop protrusion 13 is between the first transverse arm 311 and the button cap 33, the stop pin 20 is between the second transverse arm 321 and the button cap 33, the first transverse arm 311 and the button cap 33 are movable relative to the stop protrusion, and the second transverse arm 321 and the button cap 33 are movable relative to the stop pin.

In this implementation, the first boss 335 and the second boss 336 perpendicularly extend from the inner end surface 332 in a direction away from the outer end surface 331. The first boss 335 is spaced apart from the first short outer side surface 333 and the second boss 336 is spaced apart from the second short outer side surface 334. The first transverse arm 311 extends from one side of the first boss 335 away from the second boss 336. The second transverse arm 321 extends from one side of the second boss 336 away from the first boss 335. One end of the first transverse arm 311 away from the first boss 335 is approximately aligned with the first short outer side surface 333. One end of the second transverse arm 321 away from the second boss 336 is approximately aligned with the second short outer side surface 334. The first transverse arm 311 and the inner end surface 332 define a first chute therebetween. The second transverse arm 321 and the inner end surface 332 define a second chute therebetween. The stop protrusion 13 can slide in the first chute. The stop pin 20 can slide in the second chute. A displacement of the stop protrusion 13 relative to the first chute is equal to a pressing sliding distance of the button cap 33. Alternatively, a displacement of the stop pin 20 relative to the second chute is equal to a pressing sliding distance of the button cap 33. It can be understood that, both the first hook 31 and the second hook 32 can be integrally formed with the button cap 33, which makes the button 30 simple in structure and easy to manufacture, and the button 30 and the frame 10 easy to assemble.

Figure 5:
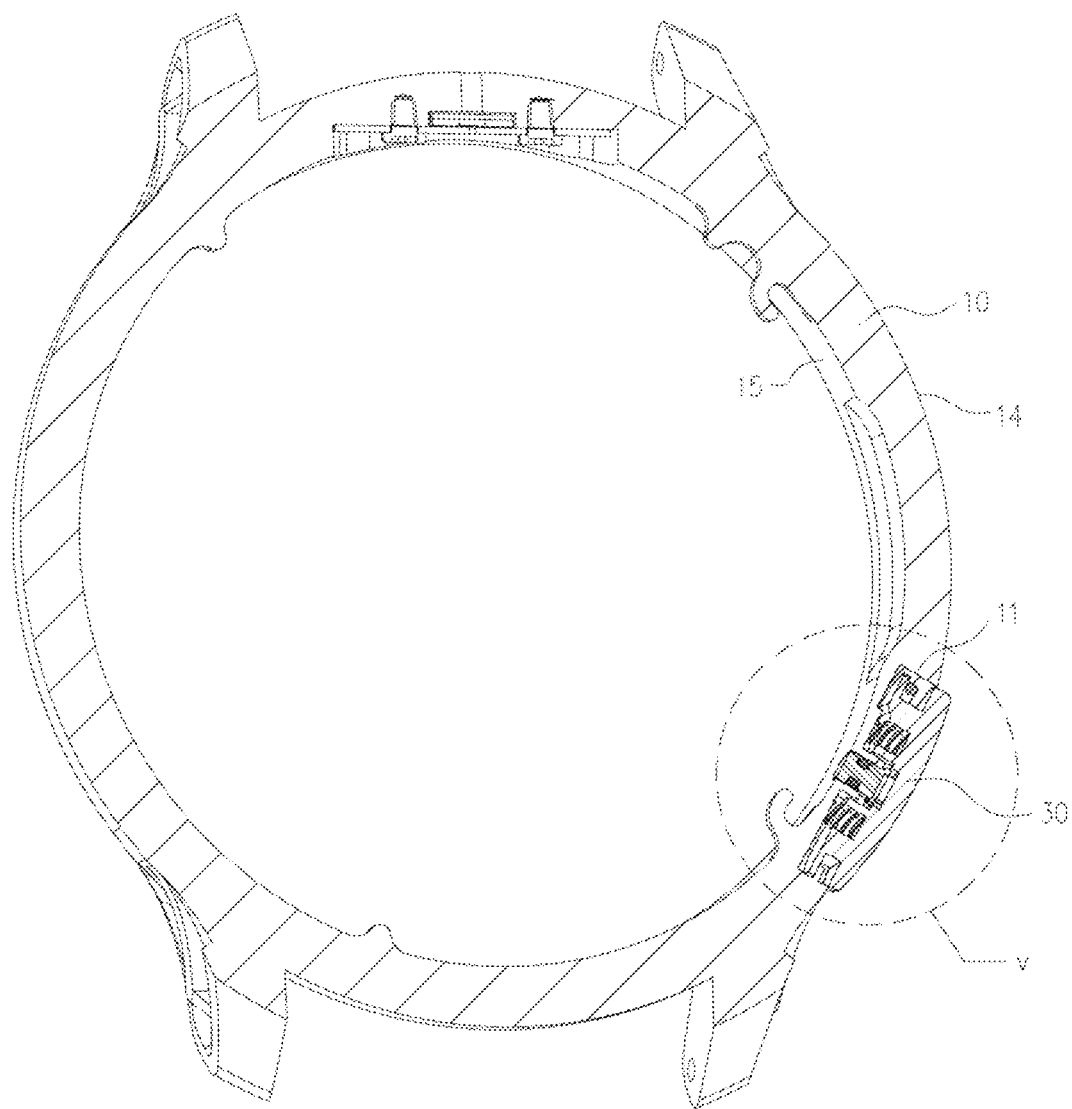
FIG. 5 is another schematic cross-sectional view of an electronic device provided in implementations of the disclosure.
Figure 6:
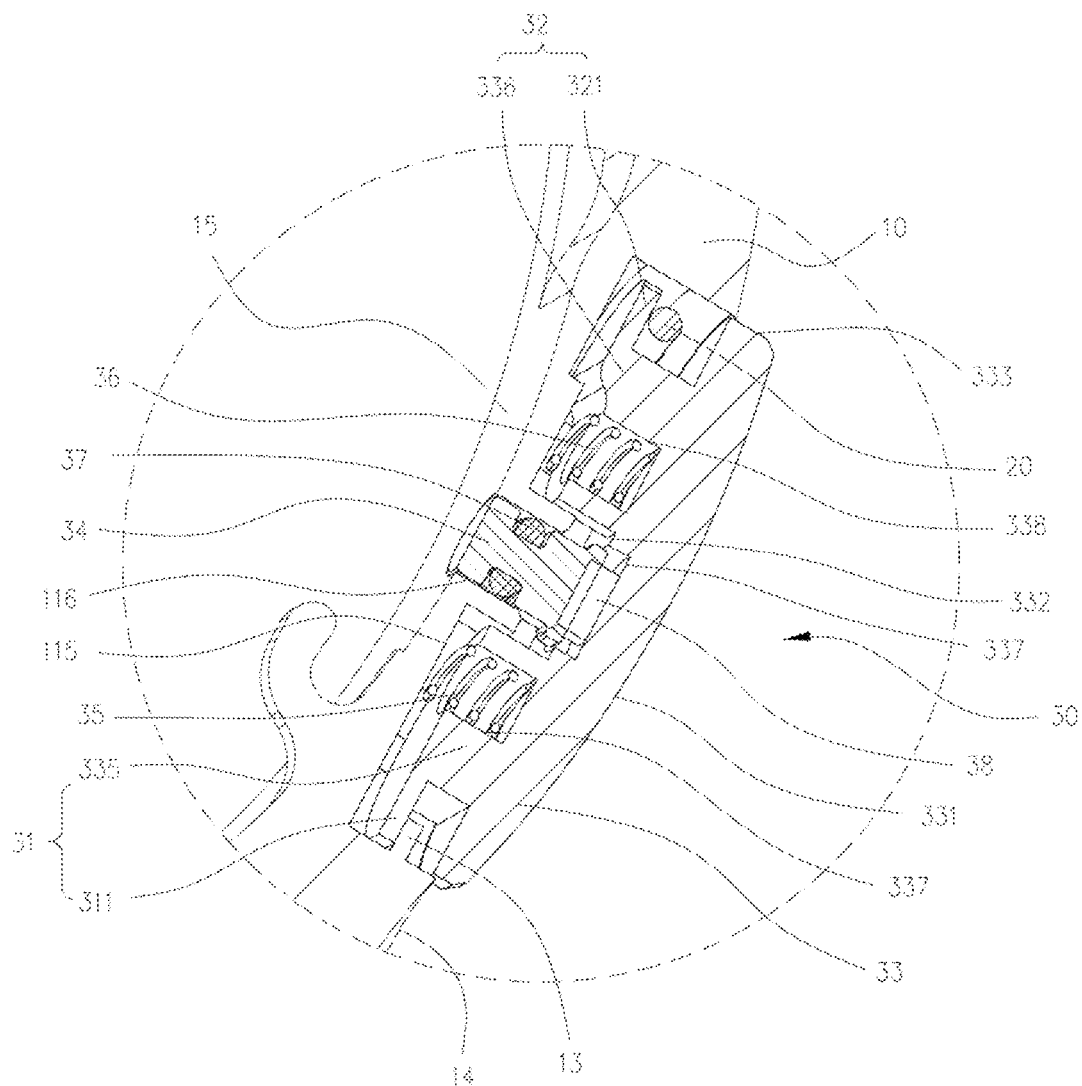
FIG. 6 is an enlarged schematic view of the electronic device at circle V in FIG. 4.

Further, referring to FIG. 5 and FIG. 6, the button hole 11 has a bottom wall 115 opposite to the button cap 33. The first boss 335 defines a first groove 337 with an opening facing the bottom wall 115. The second boss 336 defines a second groove 338 with an opening facing the bottom wall 115. The button 30 further includes a first elastic member 35 and a second elastic member 36. The first elastic member 35 is partially received in the first groove 337 and the second elastic member 36 is partially received in the second groove 338. The first elastic member 35 extends beyond one end of the first groove 337 and elastically abuts against the bottom wall 115. The second elastic member 36 extends beyond one end of the second groove 338 and elastically abuts against the bottom wall 115.

In this implementation, the first groove 337 extends from an end surface of the first boss 335 toward the inner end surface 332. The second groove 338 extends from an end surface of the second boss 336 toward the inner end surface 332. Both the first elastic member 35 and the second elastic member 36 are rectangular springs. The first elastic member 35 is fixed in the first groove 337 at one end of the first elastic member 35, and abuts against the bottom wall 115 at the other end of the first elastic member 35. The second elastic member 36 is fixed in the second groove 338 at one end of the second elastic member 36, and abuts against the bottom wall 115 at the other end of the second elastic member 36. Both the first elastic member 35 and the second elastic member 36 are used to provide the button cap 33 with elastic restoring forces in a direction away from the bottom wall 115. When the button cap 33 is pressed, the first elastic member 35 and the second elastic member 36 are compressed, the button cap 33 is moved toward the bottom wall 115, and the button post 34 can trigger the signal trigger 60. When the pressing force applied on the button cap 33 is removed, the elastic restoring forces of the first elastic member 35 and the second elastic member 36 exert on the button cap 33 and make the button cap 33 slide away from the bottom wall 115. When the first transverse arm 311 abuts against the stop protrusion 13 and the second transverse arm 321 abuts against the stop pin 20, the first elastic member 35 and the second elastic member 36 are in a pre-compressed state, so that the button 30 remains in a pressable state.

Optionally, at least one of the first elastic member 35 or the second elastic member 36 is a rectangular spring.

Optionally, at least one of the first elastic member 35 or the second elastic member 36 is a torsion spring.

Optionally, at least one of the first elastic member 35 or the second elastic member 36 is an elastic silicone block or an elastic rubber block.

Further, the frame 10 defines a button-post guide hole 116 penetrating the bottom wall 115. The button-post guide hole 116 is in clearance fit with the button post 34. The button 30 is provided with a sealing ring 37 which is fastened to a circumferential side of the button post 34 and sealingly matches the button-post guide hole 116.

In this implementation, the button-post guide hole 116 extends from the inner side surface 15 to the bottom wall 115. The button-post guide hole 116 serves as a pressing-sliding guide structure of the button 30, so that the button post 34 can maintain a slide in a fixed direction aligned with the signal trigger 60. The button-post guide hole 116 penetrates the inner side surface 15 so that one end of the button post 34 can pass through the inner side surface 155 of the frame 10 under a pressing action of the button cap 33. Specifically, the bottom wall 115 is provided with an extension boss matching the first boss 335 and the second boss 336, and the button-post guide hole 116 penetrates the extension boss, so as to increase a depth of the button-post guide hole 116 and a guiding stability of the button post 34.

Optionally, the length of the button post 34 is greater than the depth of the button-post guide hole 116, which ensures that one end of the button post 34 can move out of the button-post guide hole 116.

Optionally, one end of the button-post guide hole 116 away from the inner side surface 15 is substantially adjacent to the outer side surface 14, such that most of the button cap 33 is exposed to the outside of the outer side surface 14, and it is convenient for the button cap 33 to receive the pressing force.

Optionally, one end of the button-post guide hole 116 away from the inner side surface 15 is substantially located at a middle position between the outer side surface 14 and the inner side surface 15, thus, there is a safety distance between the button-post guide hole 116 and the outer side surface 14, so as to prevent dust and impurities outside the frame 10 from entering the button-post guide hole 116 to interfere with sliding of the button post 34 relative to the frame 10.

In this implementation, the sealing ring 37 is elastically deformable. The sealing ring 37 in a free state has an outer diameter greater than an inner diameter of the button-post guide hole 116. When the sealing ring 37 is inserted into the button-post guide hole 116 along with the button post 34, the sealing ring 37 will be compressed and deformed under compression action of the inner circumferential wall of the button-post guide hole 116, so that the sealing ring 37 can be in close contact with the inner circumferential wall of the button-post guide hole 116 to a large extent, and the sealing ring 37 can seal a gap between the inner circumferential wall of the button-post guide hole 116 and the outer circumferential wall of the button post 34. The sealing ring 37 can effectively prevent water, dust, and impurities from entering the inside of the frame 10 through the gap between the outer circumferential wall of the button post 34 and the inner circumferential wall of the button-post guide hole 116. For example, the electronic device 100 is a smart watch, and the electronic device 100 uses the sealing ring 37 to seal the gap between the button post 34 and the inner circumferential wall of the button-post guide hole 116, so that the electronic device 100 can meet 5 atmospheres (ATMs) waterproof requirement.

In an implementation, the button post 34 defines a clamping groove along a circumferential direction at one end of the button post 34 away from the button cap 33. The clamping groove has a width which is substantially equal to a difference between the outer diameter and the inner diameter of the sealing ring 37. The sealing ring 37 is sleeved on the button post 34. The sealing ring 37 is partially clamped into the clamping groove. The sealing ring 37 is detachably connected with the button post 34 to facilitate disassembly and maintenance of the sealing ring 37. When mounting the button 30 to the frame 10, the sealing ring 37 is first sleeved on the button post 34, and then the button post 34 and the sealing ring 37 are integrally inserted into the button-post guide hole 116.

Optionally, the sealing ring 37 and the button post 34 are formed integrally to increase tightness between the sealing ring 37 and the button post 34.

Optionally, the sealing ring 37 is made of silicone to improve elastic sealing performance and friction resistance of the sealing ring 37.

Optionally, the sealing ring 37 is made of rubber to prolong the service life of the sealing ring 37.

Further, the button 30 is further provided with an elastic cushion 38, and the elastic cushion 38 is elastically connected with the button post 34 and the button cap 33.

In conventional technical schemes, the button cap 33 and the button post 34 of the button 30 are formed integrally, or are firmly fixed together by other means. Generally, the button cap 33 has a relative large length between two ends. When pressing one end of the button cap 33, the other end will be lifted up. At the same time, the electronic device 100 is provided with a guide structure for slidably guiding the button post 34. When the button cap 33 is tilted up, it is easy to cause the button post 34 and the guide structure to be non-coaxial and in turn cause the button 30 to be stuck. Therefore, the button 30 and the button cap 33 are designed to form separately, and the button cap 33 is movably connected with the button post 34, which is beneficial to allowing the button cap 33 to withstand various pressing forces in various forms. As such, even if the button cap 33 is tilted up, it will not cause the button post 34 to be non-coaxial with the guide structure, and the availability of the button 30 is ensured. In an implementation, the guide structure is a through hole.

In implementations of the disclosure, the elastic cushion 38 is connected between the button cap 33 and the button post 34, the elastic deformation performance of the elastic cushion 38 allows the button cap 33 to be movable relative to the button post 34, such that the button post 34 is prevented from being stuck due to tilt-up of the button post 34, failure of the button 30 can be prevented, the effective pressing performance of the button 30 can be ensured, and the service life of the button 30 can be prolonged.

In this implementation, the button cap 33, the elastic cushion 38, and the button post 34 are sequentially stacked, and integrally extend through the frame 10. The button cap 33 is adjacent to the outer side surface 14 of the frame 10. The button post 34 is adjacent to the inner side surface 15 of the frame 10. The button post 34 is at least partially located between the outer side surface 14 and the inner side surface 15, which is beneficial for supporting button post 34 and pressing and directing the button post 34 by the frame 10. The elastic cushion 38 is located between the outer side surface 14 and the inner side surface 15.

During assembling of the button 30, the button post 34 and the sealing ring 37 are first penetrated into the button-post guide hole 116, such that one end of the button post 34 is aligned with the signal trigger 60 inside the frame 10. The elastic cushion 38 is then fixed to the other end of button post 34 away from the signal trigger 60, such that the button post 34 is securely connected with the elastic cushion 38. And then, the first hook 31 of the button cap 33 hooks the stop protrusion 13, and the button cap 33 is firmly connected to the elastic cushion 38. Finally, the second hook 32 is inserted into the button hole 11, and the stop pin 20 is inserted into the pin hole 12, so that the second hook 32 hooks the stop pin 20.

The elastic cushion 38 is substantially perpendicular to the length direction of the button post 34. The elastic cushion 38 is attached to the end surface of the button post 34 at one surface of the elastic cushion 38 which has a relatively large area. A surface of the button cap 33 close to the button post 34 is attached to the other surface of the elastic cushion 38 which has a relatively large area. The button cap 33 completely covers the elastic cushion 38 to ensure effective contact between the button cap 33 and the elastic cushion 38.

It is understood that, when a direction of a pressing force exerted on the button cap 33 is inclined relative to the button post 34, one end of the button cap 33 will be lifted up, one end of the elastic cushion 38 is compressed while the other end of the elastic cushion 38 is stretched. In other words, when the direction of the pressing force exerted on the button cap 33 is not parallel to a length direction of the button cap 33, one end of the elastic cushion 38 is compressed while the other end of the elastic cushion 38 is stretched. That is, the elastic cushion 38 absorbs an inclined force (i.e., a force which is not parallel to the length direction of the button post 34) applied by the button cap 33, which prevents the inclined force from being transferred to the button post 34, and in turn prevents the button post 34 from tilting. The elastic cushion 38 is connected with the button post 34 and the button cap 33, such that the button cap 33 is spaced apart from the button post 34. The length direction of the button post 34 can remain aligned with the signal trigger 60. As such, the button post 34 can effectively trigger the signal trigger 60 and can be reset effectively to avoid being stuck.

Optionally, one surface of the elastic cushion 38 connected with the button post 34 completely covers the end surface of the button post 34.

Optionally, one surface of the elastic cushion 38 connected with the button post 34 partially covers the end surface of the button post 34.

In implementations of the disclosure, the elastic cushion 38 is made of silicone. The elastic cushion 38 may be bonded with the button post 34 and the button cap 33 via double-sided adhesive.

Optionally, the elastic cushion 38 may also be made of metal. The elastic cushion 38 can be fixedly bonded to the button cap 33 and the button post 34 via glue.

Optionally, the elastic cushion 38 may also be an elastic foam sheet.

Further, the button cap 33 defines a fixing groove 337. The elastic cushion 38 is partially fixed within the fixing groove 337. The button cap 33 defines the fixing groove 337 between the first boss 335 and the second boss 336. The elastic cushion 38 is partially fixed inside the fixing groove 337 to increase the stability between the elastic cushion 38 and the button cap 33. Due to the compressibility of the elastic cushion 38, the elastic cushion 38 can effectively compensate a tolerance between the button cap 33 and the button post 34, so that the button 30 can work normally within the tolerance. Due to the cushioning performance of the elastic cushion 38, even under extreme conditions, an impact force applied on the button 30 during a collision can be transferred to and absorbed by the elastic cushion 38 without being transferred to the button post 34 to cause an impact to the signal trigger 60, which helps to avoid the failure of the electronic device 100 when the electronic device 100 is dropped, to prolong the service life of the electronic device 100.

Optionally, the elastic cushion 38 is bonded in the fixing groove 337 via glue. The fixing groove 337 can also prevent the glue from overflowing.

Optionally, the elastic cushion 38 can also be completely fixed in the fixing groove 337.

Figure 7:
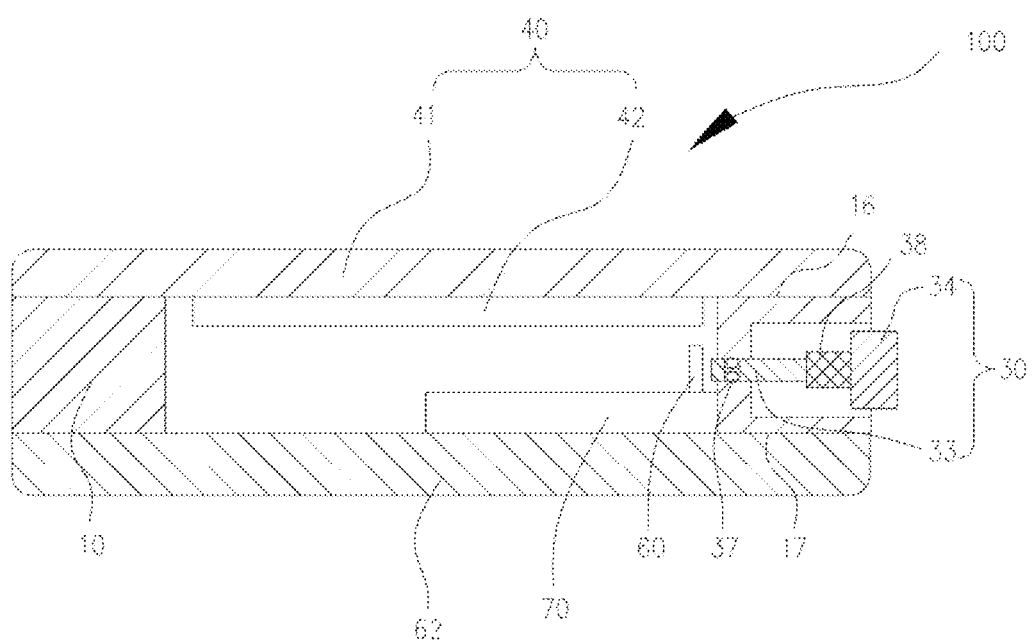
FIG. 7 is another schematic cross-sectional view of an electronic device provided in implementations of the disclosure.

Further, referring to FIG. 7, the electronic device 100 further includes a display screen assembly 40 matching the first end surface 16 of the frame 10 and a rear cover 50 matching the second end surface 17.

In this implementation, the display screen assembly 40 further includes a transparent cover plate 41 matching the first end surface 16 and a display screen 42 attached to the transparent cover plate 41 and located inside the frame 10. The transparent cover plate 41 is sealingly connected with the frame 10 and the rear cover 50 is sealingly connected with the frame 10, so as to ensure the waterproof requirement of the electronic device 100. The display screen 42 is electrically coupled with the mainboard inside the frame 10 to receive control signals from a processor on the mainboard, so that the display screen 42 can display images.

The electronic device 100 further includes the signal trigger 60 fixed inside the frame 10 and opposite to the button 30. The button 30 can trigger the signal trigger 60 to send an instruction. The electronic device 100 further includes a mainboard 70 fixed inside the frame 10. The signal trigger 60 is disposed on the mainboard 70.

In this implementation, the mainboard 70 is fixed inside the accommodating space 150. The signal trigger 60 is disposed on an edge of the mainboard 70 adjacent to the inner side surface 15. A processor is disposed on the mainboard 70. The signal trigger 60 is electrically coupled with the processor to send electrical signals to the processor. The processor converts electrical signals from the signal trigger 60 into various control instructions, and sends the control instructions to various functional components of the electronic device 100, so as to control operations of the functional components of the electronic device 100 through the button 30.

Figure 8:
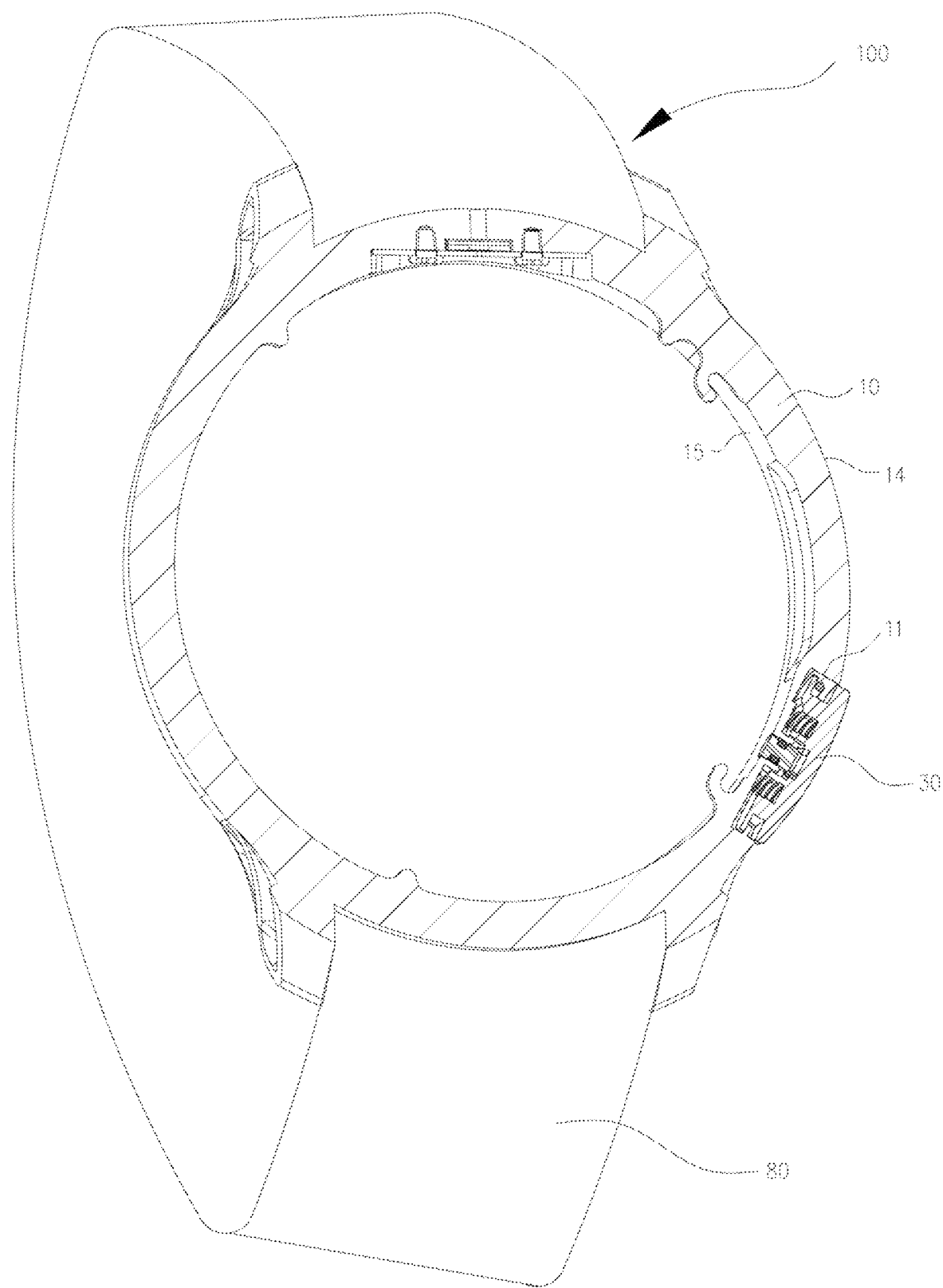
FIG. 8 is another schematic view of an electronic device provided in implementations of the disclosure.

In an implementation, referring to FIG. 8, the electronic device 100 further includes a wearable accessory 80 which is detachably connected to the frame 10. The frame 10 has two connecting portions opposite to one another. The wearable accessory 80 is a watch strap. Ends of the wearable accessory 80 are detachably connected to the connecting portions of the frame 10. The electronic device 100 is a smart watch. The frame 10 defines the button hole 11 between the two connections, such that it is easy for the user to operate the button 30.

Optionally, the electronic device 100 may also be a smart wristband. The wearable accessory 80 is a wrist strap.

In another implementation, the electronic device 100 is a mobile phone. The frame 10 has two short sides opposite to one another and two long sides 102 opposite to one another. The button 30 penetrates the long side.

Optionally, the buttons 30 penetrate the two long sides of the electronic device 100.

Optionally, two buttons 30 penetrate the long side of the electronic device 100, and the two buttons 30 may include a volume up key and a volume down key.

Optionally, one button 30 penetrates the long side of the electronic device 100. The button 30 can be a screen wake-up key, which can also be operated to turn on/off the mobile phone.

Optionally, the button 30 can also penetrate the short side of the frame 10.

Figure 9:
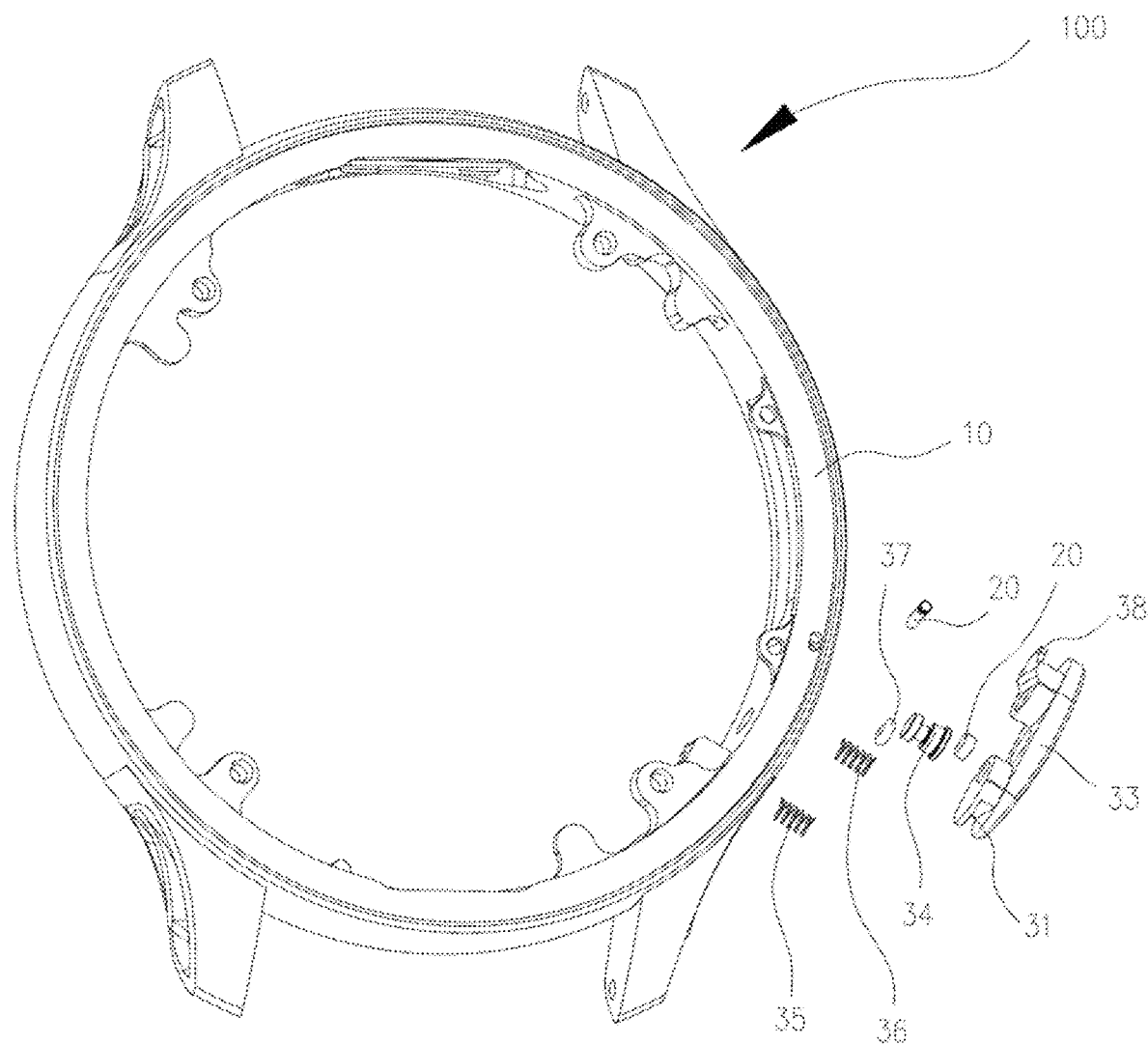
FIG. 9 is a partial exploded schematic view of an electronic device provided in implementations of the disclosure.
Figure 10:
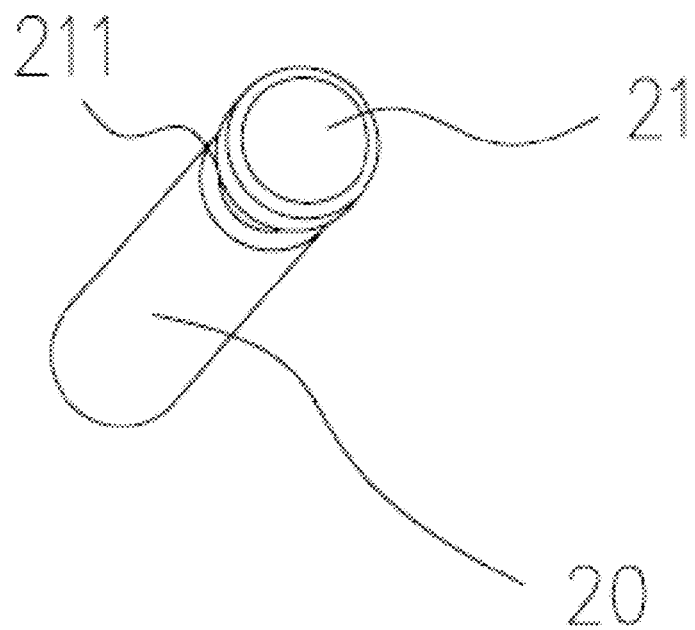
FIG. 10 is a schematic perspective view of a stop pin of an electronic device provided in implementations of the disclosure.

Further, referring to FIG. 9 and FIG. 10, the stop pin 20 has an unlocking end 21 exposing an opening of the pin hole 12 on an outer surface of the frame 10. The unlocking end 21 is provided with a pull clasp 211. The pull clasp 211 is configured to drive the stop pin 20 to slide out of and unlock from the pin hole 12.

In this implementation, the pull clasp 211 is formed on an inner wall of an annular clamping slot at one end of the stop pin 20. The pull clasp 211 is provided at one end of the stop pin 20. The stop pin 20 can be detached from the frame 10 by snapping a tool such as a caliper into the pull clasp 211, which facilitates a detachment of the button 30, so as to realize disassembly and maintenance of the frame 10 and the button 30.

Figure 11:
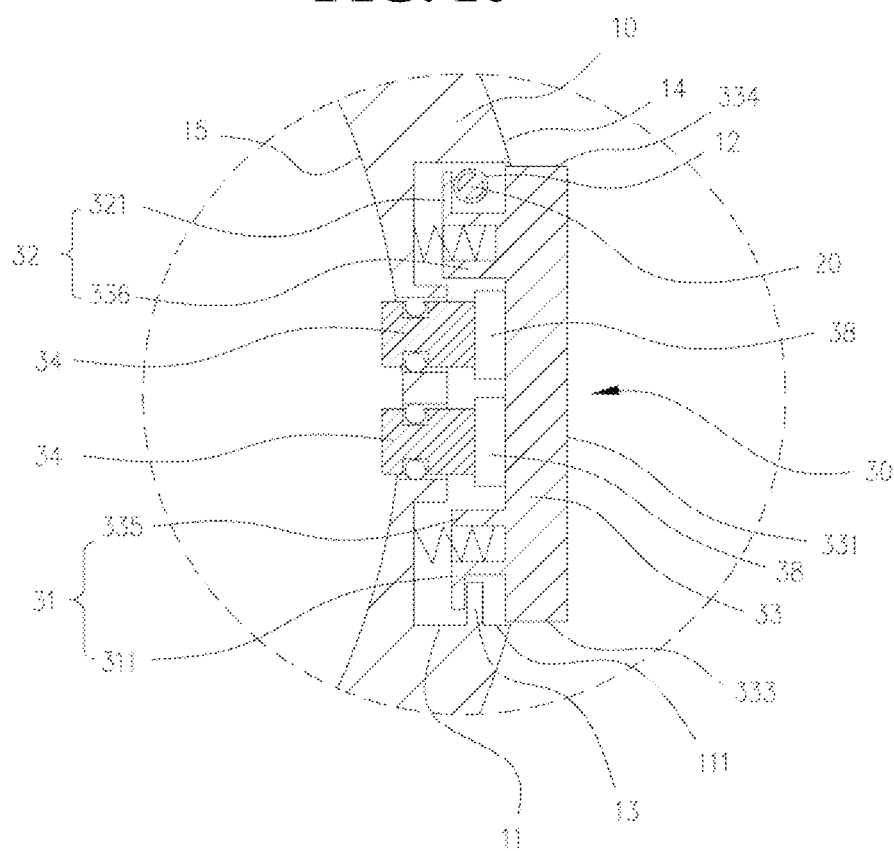
FIG. 11 is a partial schematic cross-sectional view of an electronic device provided in another implementation of the disclosure.

In another implementation, referring to FIG. 11, the button 30 is provided with two elastic cushions 38 and two button posts 34. The two elastic cushions 38 and the two button posts 34 are located between the first hook 31 and the second hook 32. One button cap 33 can be connected with the two button posts 34 via the two elastic cushions 38, respectively. Pressing two ends of the button cap 33 can drive the two button posts 34 to trigger the two signal triggers 60 respectively, so that various pressing operations can be exerted on the one button cap 33.

Figure 12:
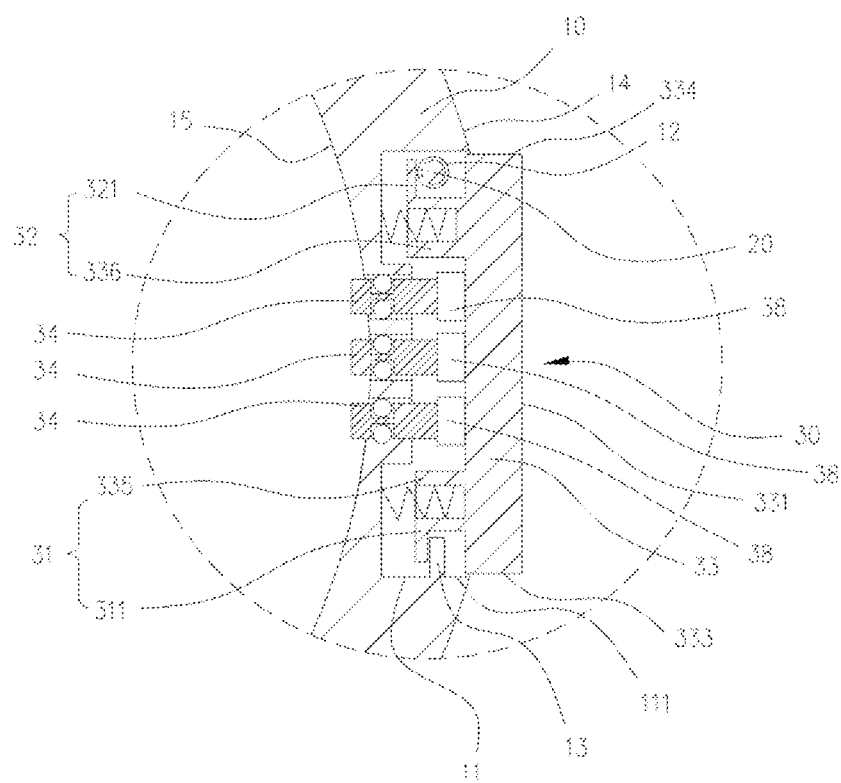
FIG. 12 is a partial schematic cross-sectional view of an electronic device provided in another implementation of the disclosure.

In another implementation, referring to FIG. 12, the button 30 is provided with three elastic cushions 38 and three button posts 34. The three elastic cushions 38 and the three button posts 34 are located between the first hook 31 and the second hook 32. One button cap 33 can be connected with the three button posts 34 via the three elastic cushions 38 respectively. Pressing two ends and a middle position of the button cap 33 can drive the three button posts 34 to trigger the three signal triggers 60 respectively, so that various pressing operations can be exerted on the one button cap 33.

The frame 10 defines the button hole 11 and the pin hole 12 in communication with the button hole 11, the inner side wall of the button hole 11 is provided with the stop protrusion 13 at a position away from the pin hole 12, and the stop pin 20 is inserted into the pin hole 12 and partially received in the button hole 11. The first hook 31 is used for hooking the stop protrusion 13 and the second hook 32 is used for hooking the stop pin 20, and thus it can be ensured that the button 30 cannot be detached from the frame 10 to provide the button 30 with a safety limit, it is easy to assemble the button 30 and the frame 10, and a structural stability is high.

While the disclosure has been described in detail above with reference to the exemplary implementations, the scope of the disclosure is not limited thereto. As will occur to those skilled in the art, the disclosure is susceptible to various modifications and changes without departing from the spirit and principle of the disclosure. Therefore, the scope of the disclosure should be determined by the scope of the claims.

What is claimed is:

1. An electronic device comprising:
   a frame, a stop pin, and a button;
   wherein the frame defines a button hole and a pin hole in communication with the button hole, wherein an inner side wall of the button hole is provided with a stop protrusion at a position away from the pin hole;
   wherein the stop pin is inserted into the pin hole and partially received in the button hole;
   wherein the button is provided with a first hook and a second hook away from the first hook, wherein the first hook is used for engaging with the stop protrusion and the second hook is used for engaging with the stop pin to cooperatively limit the button;
   wherein the button is provided with a button cap and a button post connected with the button cap, the button cap matches the button hole;
   wherein the first hook has a first boss extending from the button cap and a first transverse arm extending from one end of the first boss;
   wherein the second hook has a second boss extending from the button cap and a second transverse arm extending from one end of the second boss; and
   wherein the stop protrusion is between the first transverse arm and the button cap, and the stop pin is between the second transverse arm and the button cap.

2. The electronic device of claim 1, wherein the frame is circular.

3. The electronic device of claim 1, further comprising a signal trigger fixed inside the frame and facing the button, the button is configured to trigger the signal trigger to send an instruction.

4. The electronic device of claim 1, wherein the stop pin has an unlocking end exposing an opening of the pin hole on an outer surface of the frame, the unlocking end is provided with a pull clasp, and the pull clasp is configured to drive the stop pin to slide out of and unlock from the pin hole.

5. The electronic device of claim 1, further comprising a wearable accessory being detachably connected with the frame.

6. The electronic device of claim 1, wherein the frame has an outer side surface at an outside of the frame and an inner side surface at an inside of the frame, a first end surface, and a second end surface opposite to the first end surface, the button hole extends from the outer side surface toward the inside of the frame and is located between the first end surface and the second end surface, and the pin hole extends from the first end surface or the second end surface to the inner side wall of the button hole.

7. The electronic device of claim 6, further comprising a display screen assembly matching the first end surface of the frame and a rear cover matching the second end surface.

8. The electronic device of claim 1, wherein:
the frame has an outer side surface and an inner side surface opposite to the outer side surface;
the button hole extends from the outer side surface toward the inner side surface and has a button opening defined on the outer side surface, and the button is inserted into the button hole from the button opening; and
the button hole further has an inner circumferential wall extending from the button opening toward the inner side surface, and the inner circumferential wall is in clearance fit with an outer circumferential wall of the button.

9. The electronic device of claim 8, wherein:
the first hook and the second hook are respectively disposed at both ends of the button cap in a length direction of the button cap; and
the button post is connected with the button cap and located between the first hook and the second hook.

10. The electronic device of claim 9, wherein the button is further provided with an elastic cushion, and the elastic cushion is elastically connected with the button post and the button cap.

11. The electronic device of claim 10, wherein the button cap defines a fixing groove, and the elastic cushion is partially fixed in the fixing groove.

12. The electronic device of claim 9, wherein:
the inner circumferential wall has two long inner side surfaces, a first short inner side surface, and a second short inner side surface opposite to the first short inner side surface, wherein the first short inner side surface and the second short inner side surface are connected with the two long inner side surfaces; and
the stop protrusion extends from the first short inner side surface, and the pin hole penetrates the long inner side surfaces and is adjacent to the second short inner side surface.

13. The electronic device of claim 12, wherein the button cap has an outer circumferential surface, the outer circumferential surface has a first short outer side surface, a second short outer side surface opposite to the first short outer side surface, and two long outer side surfaces connected between the first short outer side surface and the second short outer side surface, the first short outer side surface matches the first short inner side surface and the second short outer side surface matches the second short inner side surface, and the two long outer side surfaces match the long inner side surfaces.

14. The electronic device of claim 13, wherein:
the button cap further has an outer end surface and an inner end surface opposite to the outer end surface, the outer circumferential surface is connected with the outer end surface and the inner end surface, the inner end surface is inside the button hole and away from the button opening; and
the first hook and the second hook extend from the inner end surface, and the first hook is close to the first short outer side surface and the second hook is close to the second short outer side surface.

15. The electronic device of claim 14, wherein:
the first transverse arm and the button cap are movable relative to the stop protrusion, and the second transverse arm and the button cap are movable relative to the stop pin.

16. The electronic device of claim 15, wherein:
the first boss and the second boss perpendicularly extend from the inner end surface in a direction away from the outer end surface, and the first boss is spaced apart from the first short outer side surface and the second boss is spaced apart from the second short outer side surface; and
the first transverse arm extends from one side of the first boss away from the second boss, and the second transverse arm extends from one side of the second boss away from the first boss.

17. The electronic device of claim 15, wherein:
the button hole has a bottom wall opposite to the button cap;
the first boss defines a first groove with an opening facing the bottom wall, and the second boss defines a second groove with an opening facing the bottom wall; and
the button further comprises a first elastic member and a second elastic member, wherein the first elastic member is partially received in the first groove and the second elastic member is partially received in the second groove, the first elastic member extends beyond one end of the first groove and elastically abuts against the bottom wall, and the second elastic member extends beyond one end of the second groove and elastically abuts against the bottom wall.

18. The electronic device of claim 17, wherein when the first transverse arm abuts against the stop protrusion and the second transverse arm abuts against the stop pin, the first elastic member and the second elastic member are in a pre-compressed state.

19. The electronic device of claim 17, wherein the frame defines a button-post guide hole penetrating the bottom wall, the button-post guide hole is in clearance fit with the button post, and the button is provided with a sealing ring which is fastened to a circumferential side of the button post and sealingly matches the button-post guide hole.

20. The electronic device of claim 19, wherein the bottom wall is provided with an extension boss matching the first boss and the second boss, and the button-post guide hole penetrates the extension boss.

* * * * *